United States Patent [19]

Holland

[11] 3,872,395

[45] Mar. 18, 1975

[54] SIGNAL CONDITIONING CIRCUIT APPARATUS

[75] Inventor: Vard B. Holland, San Jose, Calif.

[73] Assignee: The United States of America as represented by the National Aeronautics and Space Administration, Washington, D.C.

[22] Filed: May 5, 1971

[21] Appl. No.: 140,439

[52] U.S. Cl. .......... 330/86, 330/69
[51] Int. Cl. .......... H03f 1/36
[58] Field of Search .......... 330/86

[56] References Cited

UNITED STATES PATENTS

| | | | |
|---|---|---|---|
| 2,307,308 | 1/1943 | Sorensen | 330/86 |
| 2,790,945 | 4/1957 | Chope | 330/86 X |
| 3,030,022 | 4/1962 | Gittleman | 235/195 |
| 3,082,381 | 3/1963 | Morrill et al. | 330/86 X |
| 3,518,563 | 6/1970 | Ainsworth | 330/86 X |

*Primary Examiner*—Nathan Kaufman
*Attorney, Agent, or Firm*—Darrell G. Brekke; Armand G. Morin, Sr.; John R. Manning

[57] ABSTRACT

A signal conditioning circuit including an operational amplifier, a variable source of offset potential and four resistive impedances operatively associated in such a manner that the circuit has constant input impedance independent of gain and offset adjustments. Gain change is effected by varying one of the impedances in an amplifier feedback circuit and offset adjustment is effected through variation of the offset potential source.

2 Claims, 1 Drawing Figure

PATENTED MAR 18 1975 3,872,395
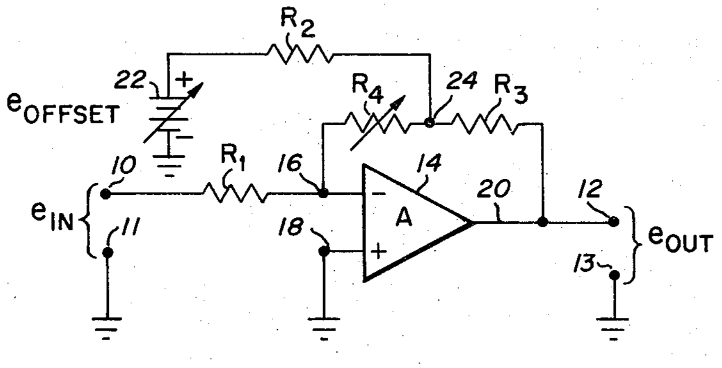
*INVENTOR.*
VARD B. HOLLAND
*BY*
[signature]
*ATTORNEY*

SIGNAL CONDITIONING CIRCUIT APPARATUS

The invention described herein was made by an employee of the United States Government and may be manufactured and used by or for the Government for governmental purposes without the payment of any royalties thereon or therefor.

BACKGROUND OF THE INVENTION

1. Field of the Invention

The present invention relates generally to electronic signal handling apparatus and, more particularly, to a novel signal conditioning circuit having independent gain and offset characteristics and requiring but a single operational amplifier.

2. Description of the Prior Art

In modern electronic equipment, it is oftentimes desirable to provide a means for amplifying or changing the offset of incoming electrical signals so as to make the signals compatible with date acquisition systems, and the like, or to make the signals appropriate for displaying on analog and recording devices. Such conditioning circuits should have, among other features, constant input impedance, linear gain adjustment, and independent gain and offset characteristics. Heretofore, prior art circuits which have provided constant input impedance have typically had offset and gain characteristics which were not independently adjustable. In those circuits which did provide independent adjustment of gain and offset, the input impedance was not constant; and in those circuits which did have independent gain and offset as well as constant input impedance, at least two amplifiers were required.

SUMMARY OF THE PRESENT INVENTION

It is therefore a primary object of the present invention to provide a novel signal conditioning circuit using a single amplifier which has linear, independent gain and offset, as well as constant input impedance characteristics.

In accordance with the present invention, a signal conditioning circuit is provided including a single operational amplifier, a variable source of offset potential, and four resistive impedances operatively associated in such a manner that the circuit has constant input impedance independent of gain and offset adjustments. One of the resistive impedances is variable from zero to some maximum value and is included in a feedback circuit of the amplifier so as to enable gain changes to be made. The variable offset potential source is connected into the feedback circuit in a manner as to enable the offset to be linearly adjusted without affecting the circuit gain.

The several advantages of the present invention will undoubtedly become apparent to those skilled in the art after having read the following detailed disclosure of a preferred embodiment which is illustrated in the single FIGURE of the drawing.

IN THE DRAWING

The single FIGURE of the drawing is a schematic diagram of a signal conditioning circuit in accordance with the present invention.

DETAILED DESCRIPTION OF THE PREFERRED EMBODIMENT

Referring now to the drawing, a preferred embodiment of a signal conditioning circuit in accordance with the present invention includes a pair of input terminals 10 and 11; a pair of output terminals 12 and 13; an operational amplifier 14 having a pair of input terminals 16 and 18, and an output terminal 20; three fixed-value resistive impedances $R_1$, $R_2$ and $R_3$; a variable resistive impedance $R_4$; and a variable source 22 of offset potential. Although the resistive impedances $R_1$–$R_4$ are illustrated in schematic form as ordinary resistors, it is to be understood that they could likewise be formed of bipolar transistors, field-effect transistors, or any other type of circuit element which exhibits a fixed or controllable resistive impedance.

The negative input terminal 16 of operational amplifier 14 is coupled to input terminal 10 through the fixed-value resistive impedance $R_1$ and the positive input terminal 18 is coupled to circuit ground. The fixed-value resistive impedance $R_3$ and the variable resistive impedance $R_4$ are connected in series between amplifier input terminal 16 and amplifier output terminal 20 to provide a gain controlling feedback path for amplifier 14. Fixed-value resistive impedance $R_2$ couples the positive terminal of variable potential source 22 to feedback circuit point 24.

The circuit functions according to the following equation:

$$e_{out} = -[R_4(R_2+R_3/R_1\ R_2) + R_3/R_1]e_{in} - R_3/R_2\ e_{offset}$$

As indicated by this expression, the output signal $e_{out}$ is comprised of two independent and algebraically added signal components. The first signal component includes the input signal $e_{in}$ multiplied by a gain control term including the variable resistance $R_4$ which indicates that the circuit gain can be controlled by varying resistance $R_4$. The second signal component is a multiple of the offset potential $e_{offset}$ which, depending upon the value of potential source 22, is either added to or subtracted from the first component and thereby permits offset adjustment of the combined output signal. This expression clearly indicates that adjustment of the gain does not in any way affect the offset, nor does adjustment of the offset in any way affect the gain. The gain is adjustable from a minimum value of $R_3/R_4$ to a maximum value imposed by the limitations of the amplifier circuit and is a linear function of the value of impedance $R_4$. Adjustment of offset is, of course, also a linear function of the offset voltage $e_{offset}$.

The only material limitations in the application of the present invention are imposed by the component accuracy and the limitations of the operational amplifier. Any type of operational amplifier will be suitable if its operational parameters are commensurate with the accuracy and range required.

As a possible alternative to the illustrated circuit, the analog input potential $e_{in}$ could be replaced by a current source with $R_1$ removed and the circuit would still have the same characteristics. Similarly, the variable potential source 22 could also be replaced by a current source with $R_2$ removed from the circuit.

Among the advantages of the present invention are that reduced power is required because only one operational amplifier is utilized; the circuit has constant input impedance; and adjustment of gain and offset are completely independent.

Although certain modifications of the present invention will undoubtedly become apparent to those skilled in the art after having read the above disclosure of the preferred embodiment, it is to be understood that this disclosure is for purposes of illustration only. Accordingly, it is intended that the appended claims be interpreted as covering all modifications which fall within the true spirit and scope of the invention.

What is claimed is:

1. A signal conditioning circuit with a constant imput impedance and variable gain and offset comprising:

first and second input terminals;

first and second output terminals;

an operational amplifier with first and second inputs and an output;

said second input terminal, said second amplifier input and said second output terminal being commonly connected;

a resistor coupled between said first input terminal and said first amplifier input;

said amplifier output being coupled to said first output terminal;

means coupled between said amplifier output and said amplifier input for feeding back a signal, said feedback means including a variable resistance and a variable potential;

the gain of said signal conditioning circuit being a function of said resistance;

the offset of said signal conditioning circuit being independent of said gain and a function of said potential; and said input impedance of said signal conditioning circuit being independent of said gain and said offset.

2. A signal conditioning circuit with a constant input impedance and variable gain and offset comprising:

first and second input terminals;

first and second output terminals;

an operational amplifier with first and second inputs and an output;

said second input terminal, said second amplifier input terminal and said second output terminal being commonly connected;

a resistor coupled between said first input terminal and said first amplifier input;

said amplifier output being coupled to said first output terminal;

a feedback circuit coupled between said first amplifier input and said amplifier output, said feedback circuit comprising a resistor connected in series with a variable resistor;

a variable source of potential;

a resistor coupled between said variable source of potential and the node between said resistors in said feedback circuit;

the gain of said signal conditioning circuit being a function of the resistance of said variable resistor;

the offset of said signal conditioning circuit being independent of said gain and a function of said variable potential; and said input impedance of said signal conditioning circuit being independent of said gain and said offset.

* * * * *